United States Patent [19]

Tsai et al.

[11] Patent Number: 5,521,121
[45] Date of Patent: May 28, 1996

[54] OXYGEN PLASMA ETCH PROCESS POST CONTACT LAYER ETCH BACK

[75] Inventors: Chia S. Tsai; Pin-Nan Tseng; Jiunn-Wen Weng, all of Hsin-chu, Taiwan

[73] Assignee: Taiwan Semiconductor Manufacturing Company, Hsinchu, Taiwan

[21] Appl. No.: 415,419

[22] Filed: Apr. 3, 1995

[51] Int. Cl.$^6$ .................................................. H01L 21/28
[52] U.S. Cl. .................. 437/190; 437/192; 437/228; 437/246
[58] Field of Search .................... 437/200, 190, 437/192, 246, 228, 228 T, 228 ST

[56]  References Cited

U.S. PATENT DOCUMENTS

| | | | |
|---|---|---|---|
| 4,833,099 | 5/1989 | Woo | 437/41 |
| 5,035,768 | 7/1991 | Mu et al. | 437/192 |
| 5,164,330 | 11/1992 | Davis et al. | 437/192 |
| 5,200,360 | 4/1993 | Bradbury et al. | 437/192 |
| 5,227,337 | 7/1993 | Kadomura | 437/192 |
| 5,254,498 | 10/1993 | Sumi | 437/190 |
| 5,320,979 | 6/1994 | Hashimoto et al. | 437/192 |
| 5,326,723 | 7/1994 | Petro et al. | 437/192 |
| 5,347,696 | 9/1994 | Willer et al. | 216/6 |
| 5,407,861 | 4/1995 | Marangon et al. | 437/192 |

OTHER PUBLICATIONS

S. Wolf "Silicon Processing for the VLSI Era, vol. I", Lattice Press p. 564, 1986.

*Primary Examiner*—George Fourson
*Assistant Examiner*—Thomas G. Bilodeau
*Attorney, Agent, or Firm*—George O. Saile; William J. Stoffel

[57]  ABSTRACT

A process for preventing the formation of precipitates on a substrate surface containing Ti (e.g., TiN) after a contact layer (e.g., tungsten layer) etch back. The process involves treating the wafer with an oxygen plasma etch after the tungsten etch back to remove the precursors of a precipitate. The oxygen plasma etch is performed at temperature of about 260° C. and a pressure about 4 torr.

22 Claims, 2 Drawing Sheets

OXYGEN PLASMA ETCH PROCESS POST CONTACT LAYER ETCH BACK

BACKGROUND OF INVENTION

1) Field of the Invention

The present invention relates to the field of semiconductor fabrication and more particularly to metal-oxide-semiconductor (MOS) fabrication and to a process for preventing the formation of precipitates on a semiconductor wafer after a contact layer etch back process.

2) Description of the Prior Art

In the manufacture of semiconductor devices, it is normally necessary to make contact to device regions on the substrate surface through an overlying dielectric layer. This is accomplished by first forming an opening or via (contact via) in the dielectric layer over the region to be contacted, and next filling the contact via with a conductive material.

In addition to filling the vias with a conductive material, it is necessary to electrically connect certain device regions with others, as well as to provide for electrical connection to external leads. Theses requirements are met by forming a wiring layer on the surface of the substrate. The wiring layers are formed by depositing a conductive material on top of the dielectric layer in which the vias have been formed. The conductive layer is then masked and etched to leave continuous lines of conducive material necessary to match the appropriate connections to the device regions of the substrate. These lines are known as interconnects.

Several conductive materials can be used as contact via fill. In larger geometry devices, the via fill and interconnect are formed simultaneously using one conductive layer. For example, aluminum (Al) can be deposited on the entire substrate, as well as in the vias in one deposition step. The areas over the vias and interconnects are then masked with photoresist and the aluminum is etched from the exposed remaining areas, leaving the vias filled with aluminum as well as forming interconnect lines on the surface of the dielectric layer.

As device geometries have shrunk to submicron levels and devices have become more densely packed on the substrate surface, the aspect ratio (ratio of height to width) of the vias to the device regions has greatly increased. Using one aluminum deposition step to form both the via contacts (plug) and interconnect lines has proven to be inadequate in devices with high aspect ratios. Problems encountered include poor step coverage, poor contact integrity, and inadequate polarity. To overcome these shortcomings, tungsten and other refractory metals are being used as a contact filling (plugs) for devices with submicron contacts before aluminum deposition and patterning. For example, a blanket tungsten (W) is deposited. Next, a blanket etch back removes the deposited tungsten from the substrate surface, leaving a tungsten (W) filling or plug in the contact openings. An aluminum layer is then deposited, covering the substrate surface including the filled contact vias. This aluminum film is then patterned and etched to form the interconnects lines between devices.

To improve the reliability of the interconnects and contacts, it has become a widely accepted practice to deposit a barrier metal layer such as TiN, TiW or the like within the contact hole and in surrounding areas. The barrier layer is formed over the dielectric layer and under the plug (e.g., W) and tile interconnect layer (e.g., Al). The barrier layer can be formed by a sputter process. This barrier layer prevents undesirable reactions between the substrate material (e.g., Si) and the wiring material or between the dielectric layer (e.g., silicon oxide) or polysilicon and the wiring material (e.g., aluminum).

A problem with the current process of etching back a contact layer that is formed over a barrier layer containing titanium is that a precipitate often forms on the barrier layer. The precipitate often appears to form a brown ring around the outside edge of the wafer. This precipitate can cause circuit failure by interfering with the metal and insulation layer formed over the precipitate and the barrier layer. Also, the precipitate can cause reliability problems such as electro migration. Many solutions have been tried without satisfactory success to eliminate this precipitation problem.

Therefore, there is a need for a process to remove or prevent the formation of precipitates after tungsten etch back. This process optimally should be simple, fast and inexpensive to implement.

Davis, U.S. Pat. No. 5,164,330 teaches tungsten etch back process for tungsten layers using a $NF_3$/Ar chemistry with three etch steps. This process reduces the amount of residue buildup in the etching reactor.

Kadomura, U.S. Pat. No. 5,227,337 discloses a two step tungsten etch back process where the first step uses $S_2F_2$ gas at the high temperature and $S_2F_2/H_2$ at a low temperature.

Petro et al., U.S. Pat. No. 5,326,723 teaches a method of cleaning a CVD process chamber used to deposit tungsten. The chamber undergoes an in-situ cleaning process with $NF_3$ and $H_2N_2$ plasmas.

Sumi, U.S. Pat. No. 5,254,498 discloses a method of forming a barrier metal structure in a contact hole to ensure good metal coverage by the metal. The invention forms an oxide layer over a metal barrier layer (e.g., W) in a contact hole and forming a contact metal over the oxide.

Woo, U.S. Pat. No. 4,833,099 teaches a $N_2$ anneal after a tungsten deposition but before forming an oxidation layer over the tungsten layer. The $N_2$ anneal inhibits the Tungsten from reacting with oxygen in the oxidation step and allow formation of a planar and uncontaminated oxide layer.

SUMMARY OF THE INVENTION

It is an object of this invention to provide a process to prevent the formation of precipitates on substrate surface that contains Titanium (Ti) after a contact layer etch back.

It is another object of this invention to provide a process to prevent the formation of and/or to remove precipitates from the surface of a water after a tungsten etch back and more particularly from substrate surface that contains titanium, Accordingly, the present invention provides a process to prevent the formation of precipitates on a substrate surface after etching back a contact layer. The substrate surface includes a layer containing Titanium. A contact layer overlies the layer containing titanium. Next, the contact layer is etched back. After the contact layer etch back, the wafer is treated with an oxygen plasma at a pressure of about 4 Torr and at a temperature of about 260° C. for about 15 seconds. This plasma etch eliminates the post contact layer etch back precipitate problem.

More particularly, the present invention provides a process to prevent the formation of precipitates on a TiN barrier layer after etching back a tungsten contact layer. A tungsten contact layer overlies the TiN barrier layer. Next, the tungsten contact layer is etched back. After the tungsten contact layer etch back, the wafer is treated with an oxygen plasma at a pressure of about 4 Torr and at a temperature of about 260° C. for about 15 seconds. This plasma etch eliminates the contact layer etch back precipitate problem.

DETAILED DESCRIPTION OF THE PREFERRED EMBODIMENTS

Figure 1:
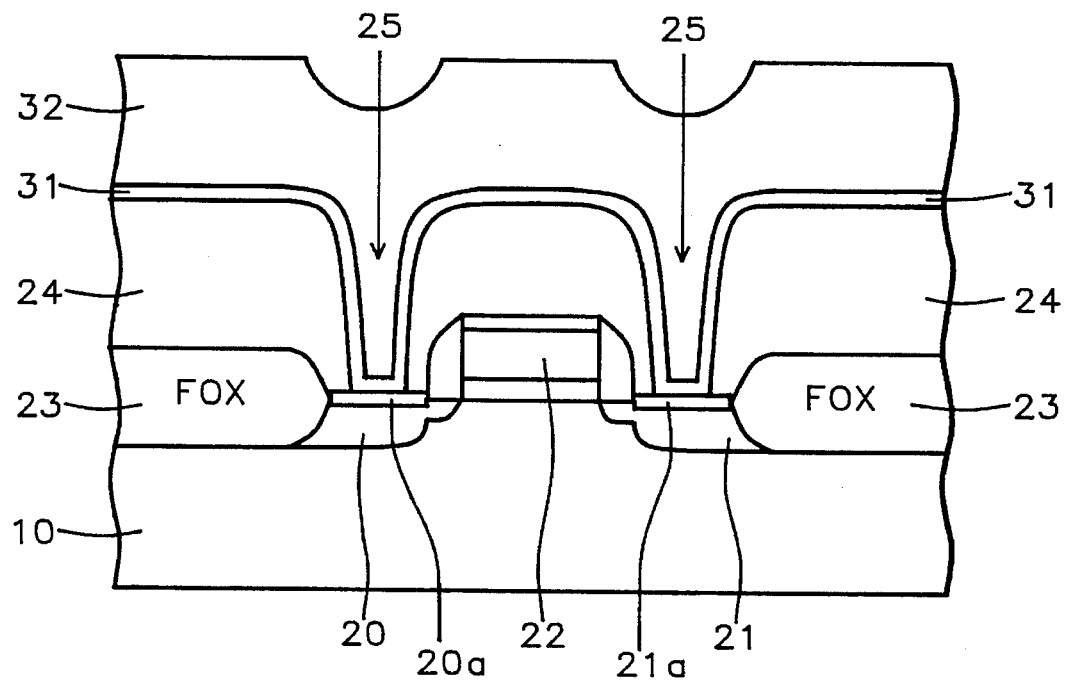
FIG. 1 shows a cross-sectional view of a wafer prior to the contact layer etch back.

Accordingly, the process of the current invention provides a post tungsten etch back process to reduce precipitation problems. FIG. 1 shows a cross-sectional view of a portion of a semiconductor substrate 10, upon which the present invention is practiced. The device shown in FIG. 1 is a typical MOS transistor and is shown for representative purposes only. Region 20 is the source, region 21 is the drain, region 22 is the gate and regions 23 are field oxide. Also shown are contact regions 20a and 21a where contact is to be made to the active areas of the device. These contact regions can be formed of a silicide. The structure shown in FIG. 1 is formed using well know prior are semiconductor process techniques. The terms substrate is mean to include devices formed within a semiconductor wafer and the layers overlying the wafer. The term substrate surface is meant to include the upper most exposed layers on a semiconductor wafer. Although a specify MOS transistor is shown, it will be appreciated that the present invention can be practiced on any type of semiconductor device or structure.

Also shown in FIG. 1 is an insulating layer 24 which may be for example silicon oxide, silicon nitride, or a similar material. Also, the insulating layer can be formed of a Borophosphosilicate tetraethylorthosilicate oxide (BPTEOS) by depositing silicon oxide at 650° to 750° C. in a low pressure chemical vapor deposition reactor. Next, contact openings or via openings (vias) 25 are formed in the insulating layer 24. Subsequently, a barrier layer 31 is formed on the substrate surface. Barrier layer 31 is formed of a titanium (Ti) containing material such as a Titanium-nitride layer (TiN "film") or a TiW layer. A titanium-nitride layer can be formed by a conventional sputter process. The barrier layer 31 can have a thickness in the range of between 800 to 1200 Å.

Afterwards a contact layer 32 is formed on the substrate surface. Contact layer 32 is preferably formed of Tungsten. A contact layer 32 comprised of tungsten can be form in a conventional chemical vapor deposition process using a reactant gas of $WF_6$. A tungsten contact layer 32 can have a thickness in the range of 6000 to 8000 Å.

Figure 2:
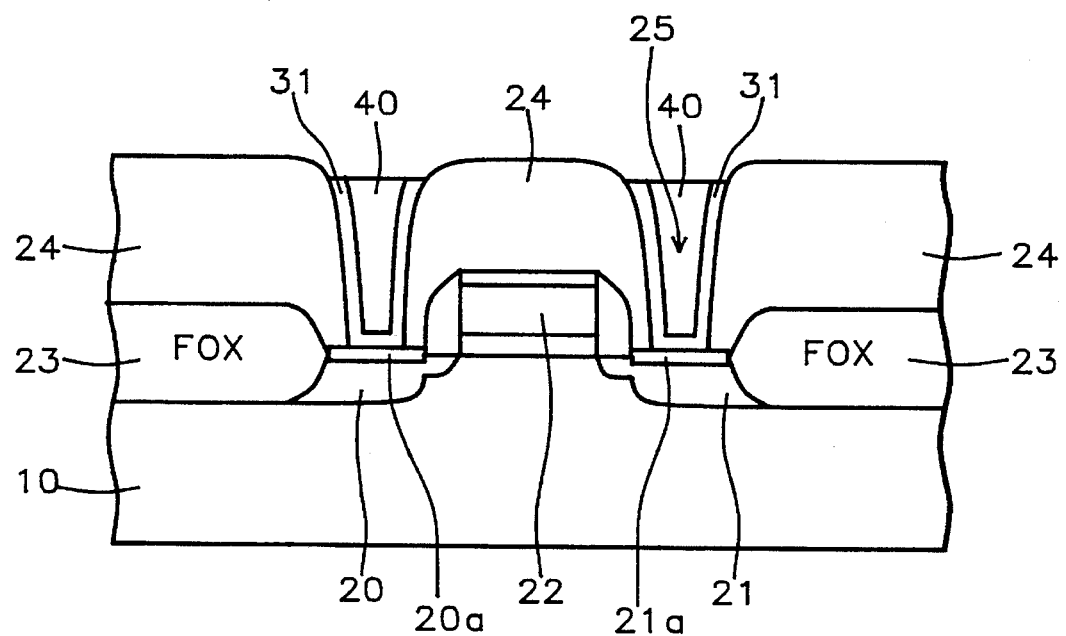
FIG. 2 shows a cross-sectional view of a wafer after the contact layer etch back.

As shown in FIG. 2, the contact layer 32 is etched back to form plugs 40 in the via holes 25. The etch back can be performed on a LAM Research Equipment etcher model 4720 with a $SF_6$ flow rate of about 150 sccm and a $N_2$ carrier and at a temperature of about 40° to 50° C. and a pressure of about 300 mTorr. After this etch back, precipitates often form on the substrate surface. Moreover, a brown ring of precipitates often forms around the edge (1 to 10 cm from the edge).

While the chemistry of the precipitate formation is not known for certain, it is theorized that the precipitate is the result of the following reaction mechanisms.

1) W etch back to the barrier layer (that contains Ti, e.g., TiN) with $SF_6$ plasma in an etcher.

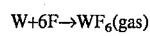
$W+6F\rightarrow WF_6(gas)$

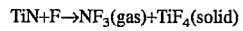
$TiN+F\rightarrow NF_3(gas)+TiF_4(solid)$

2) $TiF_4$ will absorb moisture after exposing to the air and form $Ti(OH)F_3+HF$

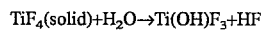
$TiF_4(solid)+H_2O\rightarrow Ti(OH)F_3+HF$

3) $Ti^{4+}$(a colorless ion) is reduced to $Ti^{3+}$(violet ion) by W through reduction-oxidation reactions.

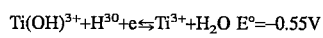
$Ti(OH)^{3+}+H^{3O}+e\leftrightarrows Ti^{3+}+H_2O\ E°=-0.55V$

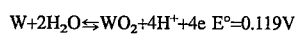
$W+2H_2O\leftrightarrows WO_2+4H^++4e\ E°=0.119V$

4) $TiF_3$ will absorb moisture to form a stable complex precipitate

$TiF_3+6H_2O\rightarrow Ti(H_2O)_6F_3(precipitate)$

From this analysis of the chemical mechanisms involved, $TiF_4$, W, and $H_2O$ are thought to be the precursors to form the precipitate. The present invention was developed to remove the precursors ($TiF_4$ and the $H_2O$) of the precipitate ($Ti(H_2O)_6F_3$) from the wafer.

To prevent the formation of these precipitates, the wafer is treated with an oxygen plasma etch. The oxygen plasma etch can be performed in Branson/International plasma Corp. Model 3100 (i.e., IPC 3100). The oxygen plasma etch is performed at a temperature in the range of 150° to 300° C., and more preferably at a temperature about 260° C. The oxygen plasma etch is performed at a pressure in the range of 3 to 5 Torr, and more preferably at a pressure of 4 Torr. The oxygen plasma etch is perform for between 10 to 90 seconds and more preferably about 20 seconds. The post contact layer etch back can use other conventional gas plasmas in addition to an oxygen plasma, but experimental results show that oxygen plasma yields the best results. The precipitate is easily trapped in the contours of the surface topology such as shown in FIG. 2 in the contours between layer 31 and the top of insulating layer 24. The plasma etch can penetrate the contours and help to remove the precipitate during etch back. On the other hand, the plasma's high temperature will provide the energy to remove the resilient precipitate.

Figure 3:
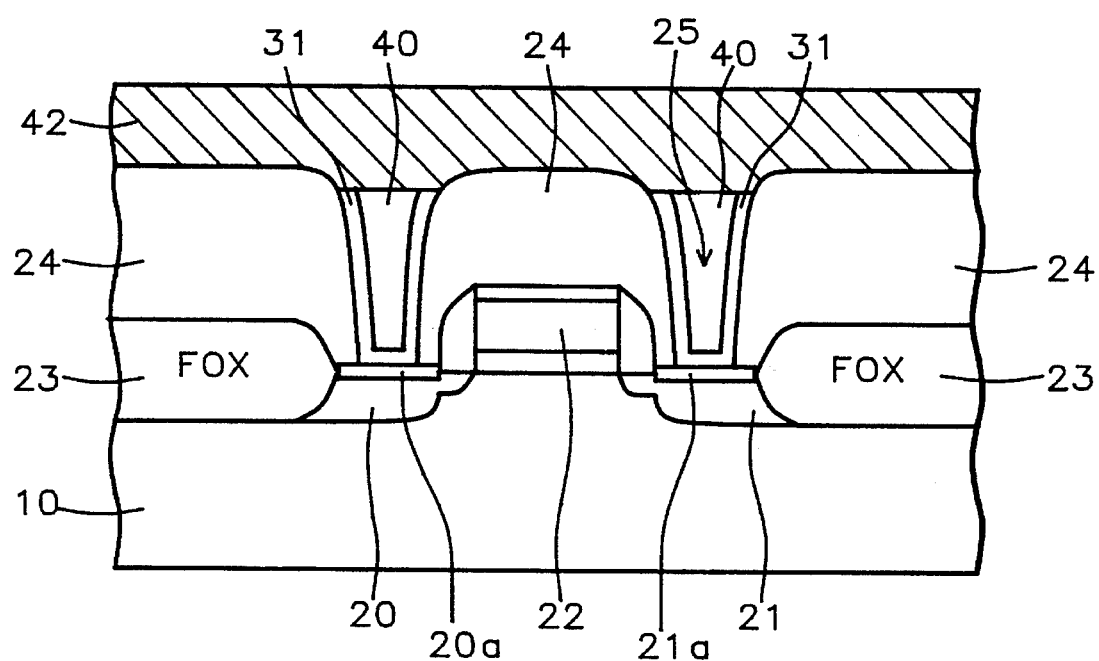
FIG. 3 shows a cross-sectional view of a wafer after an interconnect layer is formed on the substrate surface.

After the post contact layer etch back, a blanket conductive layer is formed over the substrate surface. The conductive layer can be formed of aluminum. The time period between the post contact plasma etch and the deposition of the blanket conductive layer should be minimized to prevent the formation of precipitates and other contamination forming on the substrate surface. Preferably, the time between process steps will be less than 24 hours and more preferably less than 8 hours. The conductive layer is patterned to form interconnects 42 to connect devices as shown in FIG. 3.

The present invention can be utilized in any process where a titanium containing surface is exposed to a water containing environment and a precipitate forms. The plasma process may have to be optimized to the conditions of the environment and device structure, but the invention is applicable across a wide range of devices and device structures which include titanium. Any precipitate which occurs with the fluorine-based etching of a Ti-containing layer can be prevented by the present invention.

While the invention has been particularly shown and described with reference to the preferred embodiments thereof, it will be understood by those skilled in the art that various changes in form and details may be made without departing from the spirit and scope of the invention.

What is claimed is:

1. A method of preventing the formation of precipitates on a substrate surface including a barrier layer that contains titanium after a contact layer etch back step, the method comprising the steps of:

depositing a barrier layer containing titanium on the surface of the substrate, depositing a contact layer on said barrier layer, etching back the contact layer with a fluorine containing etchant thereby exposing portions of said barrier layer containing titanium, treating the substrate surface, including said contact layer and said barrier layer containing titanium, with an oxygen plasma; and forming a conductive layer over the substrate surface within 24 hours of treating said substrate surface.

2. The method of claim 1 wherein the barrier layer containing titanium is comprised of a material selected from the group of TiN and TiW.

3. The method of claim 1 wherein the contact layer is formed of tungsten.

4. The method of claim 3 wherein the contact layer has a thickness in the range of between 6000 and 8000 Å.

5. The method of claim 3 wherein the contact layer formed of tungsten is formed by a tungsten chemical vapor deposition process using $WF_6$ as a reactant gas.

6. The method of claim 1 wherein the etching back of the contact layer is performed in a plasma etcher at a temperature in the range of 40° to 50° C., at a pressure between 300 and 500 mTorr, and with $SF_6$ and $N_2$ gasses.

7. The method of claim 1 wherein the plasma is an oxygen plasma treatment and the plasma treatment is performed at a temperature in the range of 150° to 300° C. and at a pressure in the range of between 3 and 5 torr and for a time period in the range of 10 to 90 sec.

8. The method of claim 1 wherein the barrier layer has a thickness in the range of between 800 and 1200 Å.

9. The method of claim 1 wherein the barrier layer is formed of TiN by a sputter process.

10. The method of claim 1 wherein the substrate surface further includes via openings and the etching back of the contact layer leaves portions of the contact layer in said via openings thereby forming contact plugs.

11. A method of preventing the formation of precipitates on a TiN barrier layer after etching a tungsten contact layer, the barrier layer formed on a substrate surface, the method comprising the steps of:

forming an insulation layer over the substrate surface, forming a contact hole in said insulation layer, depositing a TiN barrier layer on said insulation layer and in said contact hole, depositing a tungsten contact layer on said TiN barrier layer and in said contact hole, etching said tungsten contact layer with a fluoride containing etchant thereby exposing portions of said TiN barrier layer, the etching removing said tungsten contact layer from the surface of said insulation layer but leaving a tungsten plug in said contact hole, treating the substrate surface, including said tungsten contact layer and said TiN barrier layer, with an oxygen plasma thereby preventing the formation of a precipitate on said insulation layer, said TiN barrier layer and said tungsten plug; and forming a conductive layer over the substrate surface within 8 hours of treating the substrate surface.

12. The method of claim 11 wherein the contact layer has a thickness in the range of between 6000 and 8000 Å.

13. The method of claim 11 wherein the contact layer is formed of tungsten formed by a tungsten chemical vapor deposition process using $WF_6$ as a reactant gas.

14. The method of claim 11 wherein the etching back of the contact layer is performed in a plasma etcher at a temperature in the range of 40° to 50° C., at a pressure between 300 and 500 mTorr, and with $SF_6$ and $N_2$ gases.

15. The method of claim 11 wherein the oxygen plasma treatment is performed at a temperature in the range of 150° to 300° C. and at a pressure in the range of between 3 and 5 torr and for a time period in the range of 10 to 90 seconds.

16. The method of claim 11 wherein the barrier layer has a thickness in the range of between 800 and 1200 Å.

17. The method of claim 11 wherein the barrier layer is formed of TiN by a sputter process.

18. The method of claim 11 wherein the substrate surface further includes via openings and the etching of the tungsten contact layer leaves portions of the contact layer in said via openings thereby forming contact plugs.

19. A method of preventing the formation of precipitates on a substrate surface including a barrier layer that contains Titanium after a contact layer etch back step, the method comprising the steps of:

forming an insulation layer over the substrate surface, forming a contact hole in said insulation layer, depositing a barrier layer composed of TiN on said insulation layer and in said contact hole, depositing a contact layer composed of tungsten on the substrate surface, etching said tungsten contact layer with $SF_6$ thereby exposing portions of said barrier layer, the etching removing said tungsten contact layer from the surface of said insulation layer but leaving a tungsten plug in said contact hole, treating said tungsten contact layer, said TiN barrier layer, and said tungsten plug with an oxygen plasma thereby preventing the formation of a precipitate on said insulation layer, said TiN barrier layer and said tungsten plug; said oxygen plasma treatment is performed at a temperature in the range of between about 150° and 300° C. and at a pressure in the range between about 3 and 5 torr for a time in the range between about 10 and 90 seconds; and forming a conductive layer composed of aluminum over the substrate surface within 8 hours of treating the substrate surface.

20. The method of claim 19 wherein said contact layer has a thickness in the range of between about 6000 and 8000 Å.

21. The method of claim 19 wherein the etching back of the contact layer is perform in plasma etcher at a temperature in the range of 40° to 50° C., at a pressure between 300 and 500 mTorr, and with $SF_6$ and $N_2$ gasses.

22. The method of claim 19 wherein the barrier layer has a thickness in the range of between about 800 and 1200 Å.

* * * * *